United States Patent [19]

Tanazawa

[11] 4,059,479

[45] Nov. 22, 1977

[54] METHOD OF FORMING AND EMBOSSED PATTERN

[76] Inventor: Hisaji Tanazawa, 8-4 Hanazono Higashimachi 1-chome, Higashi, Osaka, Japan

[21] Appl. No.: 701,998

[22] Filed: July 1, 1976

Related U.S. Application Data

[63] Continuation of Ser. No. 433,472, Jan. 15, 1974, abandoned.

[30] Foreign Application Priority Data

Aug. 10, 1973 Japan .................................. 48-90436

[51] Int. Cl.² .............................................. C23F 1/02
[52] U.S. Cl. .................................... 156/640; 156/659; 156/905
[58] Field of Search ................... 156/8, 11, 14, 345, 156/640, 659, 905; 96/36.3, 37; 101/28, 32

[56] References Cited

U.S. PATENT DOCUMENTS

| | | | |
|---|---|---|---|
| 2,662,002 | 12/1953 | Sunderhauf et al. | 156/14 |
| 2,816,025 | 12/1957 | Dahlberg | 156/8 X |
| 2,926,076 | 2/1960 | Guenst | 156/345 X |
| 3,198,111 | 8/1965 | Ellis et al. | 96/37 X |
| 3,309,984 | 3/1967 | Mackay | 101/32 |

*Primary Examiner*—William A. Powell
*Attorney, Agent, or Firm*—Armstrong, Nikaido & Marmelstein

[57] ABSTRACT

A method of forming an embossing pattern in which, on the working surface of the first of a pair of steel rolls, an acid-resistant coating corresponding to the pattern intended for embossing is formed on the positive or convex form, and on the working surface of the second steel roll, an acid-resistant coating is placed thereover except on the part that will be the negative or concave form, where the second steel roll is identical in size to the first and symmetrical thereto; and then the surface part not covered by the acid-resistant coating on each roll is corroded by etching to form a concavity and convexity on the respective working surfaces thereof, causing the predetermined side etching to take place on each side surface of the concavity and convexity, so that an appropriate clearance may be formed between the side surfaces of the concavity and the convexity facing each other, as both working surfaces are coincidentally fitted together.

1 Claim, 10 Drawing Figures

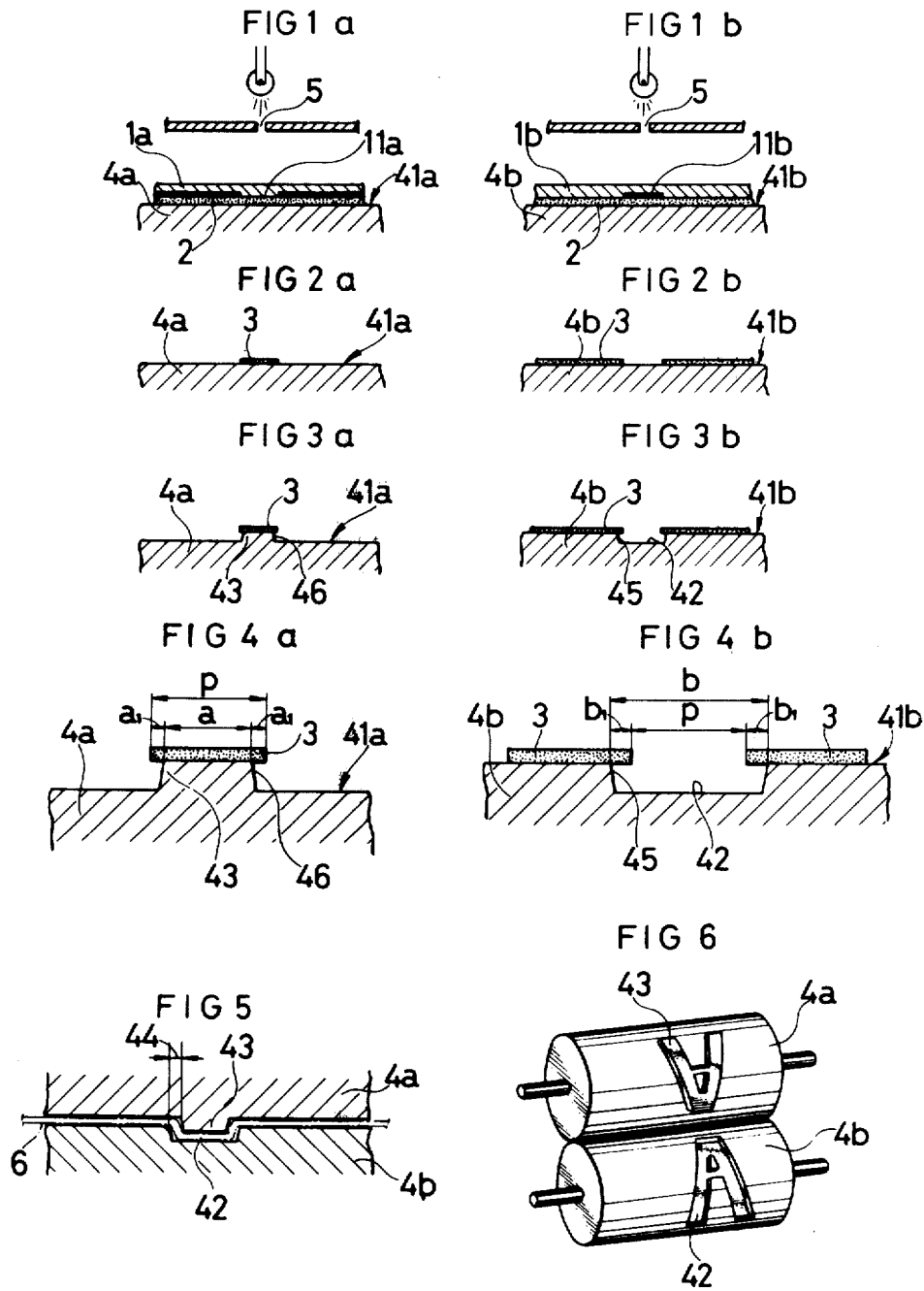

METHOD OF FORMING AN EMBOSSED PATTERN

This is a continuation, of application Ser. No. 433,472 filed Jan. 15, 1974, now abandoned.

BACKGROUND OF THE INVENTION

The present invention relates to a method of forming cooperative concave and convex patterns on the working surfaces of complimentary embossing rolls or pressing dies; etc.

To form an embossing pattern on a metal sheet, it is necessary to form the concave and convex patterns as the matrices corresponding to the embossing pattern, and in order that the resulting embossing to be made smoothly, it is necessary to predetermine the concavity on the working surface opposing and cooperating with the working surface having the convexity such that a clearance equal to the thickness of the work-piece is provided. If the correct clearance is not provided, the work-piece would be broken or sheared as it is pressed. It is, however, very difficult to form the working surfaces of the steel rolls or dies in concave and convex patterns with the clearance equal to the thickness of the metal sheet provided there-between, and it is well nigh impossible to do so especially when complex, arbitrary or unusual patterns are chosen.

Heretofore, as the metal stock to be worked, soft aluminum sheet or very thin steel sheet has been chosen; it was passed while pressing between a steel roll on which the concave-convex pattern was formed, on one hand, and a soft roll with smooth surface of compressed paper, rubber, etc., on the other, to let the metal sheet worked undergo a plastic deformation, taking advantage of the surface deformation of the soft-roll, thereby forming the embossed pattern.

A working method of this type has proven most disadvantageous, however, because the working surface of one of the rolls is soft, and thick steel and stainless steel could not be worked. Moreover, the forming dies were excessively consumed due to wear In order to form a pattern on thick metal sheets in general or thick stainless sheets in particular, it is necessary to use steel rolls with high rigidity for both working rolls, but the process of forming the same pattern symmetrically on two steel rolls with a clearance equal to the thickness of the work-piece provided on one of the rolls involves the difficulty mentioned above. For this reason, hitherto, embossed patterns could not be formed on thick steel sheets and thick stainless sheets, with satisfactory results.

SUMMARY OF THE INVENTION

The present invention relates to a method of forming the concave and convex patterns for embossing on the working surfaces of steel rolls or press dies by subjecting them to photoetching. Recently, the advancement of photography has made it possible to have transparent films identical in size and pattern, but one negative and the other positive. Then, by performing the etching procedure, using these two types of transparent films as the masks for photoetching the working surfaces of the rolls, the convex and concave surfaces for embossing which are exactly inversed in pattern are respectively formed, and moreover, by taking an appropriate time, each side surface or dimension of the concavity and the convexity may be etched simultaneously, thus forming the convex and concave patterns to a depth or height equal to the thickness of the work-piece.

Heretofore, in the art of etching, the side etching of the surface to be worked was regarded as manifesting itself as an error in the working dimension, and efforts have been expended to curtail such error. Quite to the contrary, according to this invention, the side-etching is effectively utilized to provide the clearance between the working surfaces of rolls or dies. Thus a previous disadvantage is utilized as an advantage to achieve new and unexpected results.

An object of this invention is to provide a method for forming the surfaces of a pair of steel rolls or dies in identical complimentary and cooperative patterns and between which a desired uniform clearance desired is provided as the rolls are put together, in order to make the embossing of thick steel sheets or thick stainless sheets practicable.

Another object of the present invention is to provide a method of forming convex and concave patterns for embossing where these patterns are on the working surfaces of the rolls or dies and are produced by photoetching techniques employing a pair of transparent films with patterns drawn identical in size, but one positive, and the other negative such that when they are placed on their respective rolls and photoetching carried out to produce cooperating and complimentary concave and convex patterns on those rolls.

BRIEF DESCRIPTION OF THE DRAWINGS

FIGS. 1, a and b, through 3, a and b, illustrate the steps for forming the convex and concave patterns on the working surfaces by subjecting them to photoetching in accordance with this invention, with the indicated parts of each of the pair of working surfaces being distinguished by suffixing the reference numbers with a and b;

FIGS. 4, a and b, illustrate enlarged views of FIGS. 3, a and b, showing the conditions for forming the etched side;

FIG. 5 represents a sectional view showing the conditions under which the work-piece is subjected during embossing, with both working surfaces being placed in a cooperative relationship and FIG. 6 illustrates an oblique view of the embossing rolls.

DETAILED DESCRIPTION OF THE INVENTION

According to this invention, for the purpose of subjecting the working surfaces 41a, 41b of a pair of steel rolls to an etching procedure, two (2) sheets of transparent masks 1a, 1b, are placed on the respective rolls. On one sheet is expressed opaquely the predetermined pattern 11a corresponding to the etching pattern and on the other sheet is transparently expressed a symmetric pattern 11b of the same size as that of the former. Before the placing of the masks and on both working surfaces 41a, 41b of the rolls 4a, 4b which have been subjected to such surface treatments as quenching, polishing, etc., a light sensitive coating 2 is applied, and dried. Then, with the mask having the pattern 1a opaquely expressed is closely stuck on one of the rolls, and the mask 1b having the complimentary and co-operating pattern transparently expressed on the other, respectively, a light sensitive coating 2 is exposed to light, as is well known, through a slit 5, while turning the rolls 4a, 4b respectively at a low speed, by permitting a light source, such as a carbon arc lamp, etc., to glow above the masks (FIG. 1a, b).

Each working surface 41a, 41b having been exposed as described hereinbefore developed by the dipping method or other well-known methods, using a developer including such solvents as water or ammonia water for water soluable light sensitive coatings and trichloroethylene, etc., for solvent type light sensitive coatings, depending on the type of development of the light sensitive coating 2. The exposed part of the light sensitive coating 2 is left as acid resistant coating 3, and the unexposed part is removed. Accordingly, on the roll 4a on which the mask 1a with the transparent pattern closely stuck thereon, the pattern is drawn positive with the acid-resistance coating 3, while on the other roll 4b on which the mask 1b with the opaque pattern is closely stuck, a complimentary and cooperating pattern of the same size is expressed negatively with the acid-resistant coating 3 (FIG. 2a, b).

Thereafter, the 2 rolls 4a,4b are installed on the etcher, and their exposed surfaces are etched, leaving only the parts of the working surfaces covered by the acid-resistant coatings 3, by uniformly blowing onto the roll surfaces, by the spraying or other method, etc., ferric chloride, nitric acid, hydrochloric acid or other etching solutions, depending on the material of the roll, thereby forming convex surface 43 on one roll 4a and concave surface 42 on the other roll 4b (FIG. 3).

As the etching process proceeds to some degree, active surfaces become exposed on the side of the convexity 43 covered with the acid-resistant coating 3; as a result, the etching action occurs not only on the exposed surface not covered by the acid-resistant coating 3 but also on the side surface 46 of the convexity 43 covered by the acid-resistant coating 3, giving rise to the so-called side etch phenomenon. Accordingly, as shown in FIG. 4 a, b, the working surface 41a initially having a pattern width of P on which the pattern has been expressed in a convex or positive fashion with the acid-resistant coating is narrowed by $a_1$, because of etching on both sides thereof due to the side etch. On the other hand, the working surface 41b on which the pattern has been expressed in a concave or negative fashion is widened by $b_1$ likewise because of etching due to the side etch.

After the etching process is completed, the working surface 41a, 41b are finished by removing the acid-resistant coating 3 remaining thereon by using a solvent suitable for the coating.

As the embossing patterns on the 2 rolls 4a, 4b having been subjected to a surface treatment by the method described above are fitted together, a clearance 44 of $a_1 + b_1$ is formed due to the side etch between the side walls of the concavity 42 and the convexity 43 (FIG. 5). Accordingly, if this clearance is established and produced to be equal to the thickness of the work-piece, then, when such a work-piece 6 such as a thick steel sheet, thick stainless sheet, etc., is pressed, using the pair of steel rolls 4a, 4b thus obtained with the embossing patterns formed on the roll surfaces, the work-piece 6 easily undergoes a plastic deformation, forming the embossed pattern, because the clearance 44, equal to the sheet thickness, is formed between the concavity and the convexity of the embossing pattern. It is also well-known that the respective side etch widths $a_1$, $b_1$ for forming the clearance 44 may be set to the desired predetermined dimensions through the choice of the etching method.

While in the foregoing, a method of forming embossing pattern on the working surface of the roll has been described, the process of forming the male-female embossing patterns on the working surfaces of a pair of plain press dies may be similarly conducted by applying the well-known exposure etching method for flat sheets.

With regard to the method of expressing identical co-operating and complimentary positive and negative patterns of acid-resistant coating on the working surfaces, when one of the light sensitive coatings to be applied on the working surfaces is formed with an insoluble posi-posi-type light sensitive solution which turns soluble under exposure, and the other with the soluble posi-nega-type light sensitive solution which turns insoluble under exposure, transparent masks for expressing the desired pattern, both of which are positive or negative, may be used.

Since according to this invention, the embossing pattern is formed by photoetching the surface of the steel roll or steel die, etc., which has been subjected to such surface treatments such as polishing, etc., as described above, no strain is incurred from the quenching performed after forming the pattern as formerly occurred. Notably, because embossing patterns with a clearance corresponding to the sheet thickness formed at a very high dimensional accuracy are formed on the pair of steel rolls, embossing is made possible with thick steel sheets or thick stainless sheets. Moreover, because of both working surfaces being composed of such metal as steel, the durability and service life of the pattern are markedly prolonged.

In addition, as a clearance is formed between the concavity and the convexity for the patterns which were initially identical in size by taking advantage of the side etching phenomenon that takes place at the time of the etching process, dimensional accuracy is high; treatment is easy; manufacturing is economical; and many other excellent effects are achieved.

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method of forming an embossing pattern which is comprised of providing on one of a pair of working surfaces, a soluble light sensitive coating which turns insoluble under exposure, while on the other, providing an insoluble light sensitive coating which turns soluble under exposure placing on one of the working surfaces, a transparent mask on which a predetermined pattern coordinated to an etching pattern is transparently or opaquely expressed and is closely fitted onto the light sensitive coating, while on the other working surface, another transparent mask of the same type on which the aforementioned pattern is symmetrically expressed is similarly closely fitted; then, exposing each working surface such that on one working surface, the pattern coordinated to that to be embossed is drawn positive with an acid-resistant coating, while on the other working surface, another pattern symmetrical and identical in size to the aforementioned pattern is drawn negative, thereafter, both working surfaces are subjected respectively to an etching treatment, thereby forming a concavity and a convexity corresponding to the patterns of the acid-resistant coatings, while etching treatment is applied such that a predetermined etching is produced on the sides of the concavity and the convexity, so that an appropriate clearance may be formed between the side surfaces of the said coordinated concavity and convexity.

* * * * *